(12) United States Patent
Sekine (10) Patent No.: US 7,749,691 B2
(45) Date of Patent: Jul. 6, 2010

(54) METHOD OF MANUFACTURING A PHOTOELECTRIC CONVERSION DEVICE USING A PLURALITY OF RETICLES

(75) Inventor: Yasuhiro Sekine, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 801 days.

(21) Appl. No.: 11/212,649

(22) Filed: Aug. 29, 2005

(65) Prior Publication Data

US 2006/0046162 A1 Mar. 2, 2006

(30) Foreign Application Priority Data

Aug. 31, 2004 (JP) ............................. 2004-252606

(51) Int. Cl.
*G03C 5/00* (2006.01)
(52) U.S. Cl. ..................... 430/394; 430/311; 430/5
(58) Field of Classification Search ............... 430/5, 430/394, 22, 311–313
See application file for complete search history.

(56) References Cited

U.S. PATENT DOCUMENTS

| | | | | |
|---|---|---|---|---|
| 5,811,222 A | * | 9/1998 | Gardner et al. | 430/312 |
| 5,972,567 A | * | 10/1999 | Hu | 430/312 |
| 6,266,192 B1 | | 7/2001 | Sekine et al. | 359/569 |
| 6,307,618 B1 | | 10/2001 | Suzuki et al. | 355/53 |
| 6,441,886 B2 | | 8/2002 | Suzuki et al. | 355/71 |
| 6,506,544 B1 | | 1/2003 | Hori et al. | 430/394 |
| 6,641,981 B1 | | 11/2003 | Kaneko et al. | 430/311 |
| 7,087,983 B2 | | 8/2006 | Itano et al. | |
| 2004/0070039 A1 | | 4/2004 | Sekine et al. | 257/428 |
| 2004/0105022 A1 | | 6/2004 | Hirayama et al. | 348/272 |
| 2004/0126934 A1 | | 7/2004 | Itano et al. | |
| 2004/0229410 A1 | * | 11/2004 | Takizawa | 438/149 |
| 2006/0046162 A1 | | 3/2006 | Sekine | 430/5 |
| 2006/0176461 A1 | | 8/2006 | Sekine | 355/67 |

FOREIGN PATENT DOCUMENTS

| | | |
|---|---|---|
| EP | 1 401 023 A2 | 3/2004 |
| JP | 6-140306 A | 5/1994 |
| JP | 2000-199973 | 7/2000 |
| JP | 2002-110511 | 4/2002 |
| JP | 2003-151880 | 5/2003 |
| JP | 2004-111802 A | 4/2004 |
| JP | 2004-111867 | 4/2004 |
| JP | 2004-111871 | 4/2004 |
| JP | 2004-134524 | 4/2004 |
| JP | 2004-153120 | 5/2004 |
| JP | 2004-153131 | 5/2004 |

* cited by examiner

*Primary Examiner*—Mark F Huff
*Assistant Examiner*—Stewart A Fraser
(74) *Attorney, Agent, or Firm*—Fitzpatrick, Cella, Harper & Scinto (57) ABSTRACT

A method of manufacturing a photoelectric conversion device. The method includes the steps of arranging a plurality of reticles, on each of which a mask pattern region is formed, in an arrangement direction and using at least two of the plurality of reticles in the method, such that, in at least one of the reticles being used, (i) a center of the at least one reticle, which is aligned with an optical axis of light for exposure, is shifted from (ii) a center of the mask pattern region formed on the at least one reticle, in a direction parallel to the arrangement direction of the plurality of reticles, and performing the exposure of a predetermined region on a wafer using the at least two of the plurality of reticles, in order to manufacture the photoelectric conversion device.

8 Claims, 7 Drawing Sheets

METHOD OF MANUFACTURING A PHOTOELECTRIC CONVERSION DEVICE USING A PLURALITY OF RETICLES

This application claims priority from Japanese Patent Application No. 2004-252606, filed Aug. 31, 2004, which is hereby incorporated by reference herein.

BACKGROUND OF THE INVENTION

1. Field of the Invention

The present invention relates to a method of manufacturing a semiconductor device, and, more particularly, to a method of manufacturing a semiconductor device having a size equal to or larger than the field size of exposure equipment used in a semiconductor device manufacturing process.

2. Related Background Art

An image pickup element for a digital camera or an X-ray radiographing image pickup element, a large scale system LSI, a long sensor used for a scanner, or the like, a heater board of a long head used in a printing head of a bubble jet system, and the like, are severally formed larger in device size than those of ordinary ones. Sometimes, a semiconductor device (hereinafter sometimes referred to as a "chip"), having a size equal to or larger than the field size or the exposure equipment, is frequently needed. The chip having the size equal to or larger than the field size of the exposure equipment is generally manufactured by the so-called divided exposure process, in which the chip is divided into a plurality of areas, and exposure is performed by being divided into a plurality of times using a plurality of masks corresponding to the respective areas.

However, there is a case wherein a "difference" is generated at a joining part of patterns at boundary parts between each area at which the divided exposure is performed in a semiconductor device manufactured by the divided exposure processes. The "difference" means the differences in position, shape and size between a pattern formed in a certain area in which the divided exposure has been performed and a pattern formed on an area adjoining the area. The difference is hereinafter referred to as a "pattern difference". For suppressing the dispersion of the characteristics of a semiconductor device caused by the pattern difference, it is necessary to design mask patterns in anticipation of the components of the pattern difference. At that time, it is also necessary to anticipate the dispersion of the manufacturing processes. However, there is a problem in which a chip design of a fine pattern fully utilizing the intrinsic performance of the exposure equipment is limited, because the design rule of the whole chip must be loosened in the case of performing such a mask pattern design.

Moreover, when an image is photographed using a solid state image pickup element having a positional difference or dimensional difference on both the sides of the boundary part of each area having received divided exposure, stripe-like image unevenness is sometimes generated at the boundary part. The generation of the stripe-like image unevenness means that the amounts of light entering a light receiving portion of a photoelectric conversion element, or the read amounts of photoelectrically converted electrical charges differ from each other on both sides of the boundary part. It is conceivable that the difference of the amount of light entering the light receiving portion of the photoelectric conversion element is generated by the differences of relative positional relations between the light receiving portion, the light shielding film, color film, micro lens, and the like, of the photoelectric conversion element. Moreover, it is conceivable that the difference of the read amounts of electrical charges is caused by the difference of the read voltage components by capacity division, on both sides of the boundary part, and it is also conceivable that the difference of the voltage components is caused by the difference of positional relations of the electrodes constituting the capacity.

Accordingly, it is necessary to make the dispersion of every alignment and process of each area receiving divided exposure smaller, as much as possible, in a divided exposure process. Japanese Patent Application Laid-Open No. 2004-153120 and Japanese Patent Application Laid-Open No. 2004-153131 disclose a technology of reducing the dispersion of the alignment and the process of each area receiving the divided exposure. However, because it is impossible to remove alignment errors and the dispersion of processes completely, it is realistic to introduce the design increasing margins for the alignment errors and the dispersion of every process. U.S. Published Patent Application No. 2004/0105022 A1 (Japanese Patent Application Laid-Open No. 2004-111867), Japanese Patent application Laid-Open No. 2004-111867), Japanese Patent Application Laid-Open No. 2004-111871, U.S. Published Patent Application No. 2004/0070039 A1 (Japanese Patent Application Laid-Open No. 2004-134524) disclose technologies for increasing the margins to the alignment errors, and the dispersion of every process.

Moreover, Japanese Patent Application Laid-Open No. 2002-110511 describes the setting of a focus offset value to each shot of joining exposure. U.S. Pat. No. 6,506,544 (Japanese Patent Application Laid-Open No. 2000-199973) describes the use of a common pattern and a not common pattern as a pattern formed on a reticle used for divided exposure. Japanese Patent Application Laid-Open No. 2003-151880 describes the regulation of a field diaphragm, a slit width, and the like, in a joining part at the time of duplicate exposure. However, none of the disclosed contents proposes improvement means to the aberration characteristic owned by the exposure equipment essentially.

It is anticipated that it becomes necessary to make the pattern difference smaller as the miniaturization of a line width further progresses in the future. Then, it is desired to make the pattern difference smaller, based on the individual technologies or the technology combining the individual technologies disclosed in the patent documents mentioned above.

It is an object of the present invention to solve the various problems caused by the pattern difference in a semiconductor device manufactured by divided exposure by making the pattern difference smaller, as much as possible, or by adjusting the generation position of the pattern difference.

SUMMARY OF THE INVENTION

One of the methods of manufacturing semiconductor devices according to the present invention is a method of manufacturing a semiconductor device performing divided exposure of a predetermined region on a wafer using two or more reticles on each of which a mask pattern is formed, wherein an optical axis of light for exposure and center positions of the mask patterns formed on the reticles are made to be different from one another when at least adjoining two areas are exposed. According to the method of manufacturing the semiconductor device having such a feature, a boundary line of adjoining areas, i.e., a joint between patterns, is exposed by light in an area in which an image height is low, where aberration is small.

Other features and advantages of the present invention will be apparent from the following description taken in conjunction with the accompanying drawings, in which like reference characters designate the same or similar parts throughout figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

One feature of the present invention is related to a method of manufacturing a semiconductor device performing divided exposure of a predetermined region on a wafer using two or more reticles on each of which a mask pattern is formed. For more details, in at least one of the two or more reticles used for the divided exposure, a center of the reticle and a center of a mask pattern forming region formed on the reticle are different from each other.

By performing the divided exposure using such a reticle, it becomes possible to join patterns in an area in which aberration, especially distortion, is small.

The center of a mask pattern forming region is explained here. Usually, on a reticle, a pattern for forming a semiconductor device is formed over a predetermined area. The center of the mask pattern forming region indicates the center of the area on the reticle in which the pattern is arranged. Moreover, when the pattern forming region is a rectangle, an intersection point of diagonal lines may be considered to be the center. However, when the pattern forming region is not a rectangle, the center can be considered to be replaced with a center of gravity. Alternatively, by supposing a rectangle enclosing all of the ends of the area on the reticle in which the mask pattern is formed, the center of the mask pattern forming region may be considered to be the center of the supposed rectangle.

The difference is effective, as long as the center of a reticle and the center of a mask pattern forming region is different from each other, even a little. In particular, in the case where wherein the reticle is regarded as being substantially a rectangle, when the 10% or more of the lengths of the vertical side and the horizontal side are shifted, the effect is large. Moreover, the center of the reticle is an area in the neighborhood of which the optical axis of exposing light is located.

Moreover, another feature of the invention is a method of manufacturing a semiconductor device including at least one divided exposure process, wherein, when at least two adjoining areas are exposed, the optical axis of exposing light and the center position of a mask pattern formed on a reticle are made to be different from each other. According to this method, the boundary line of the adjoining areas, i.e., a joint between patterns, is exposed by the light in an area in which an image height is low, where aberration is small.

If the center position of a reticle and the center position of a mask pattern formed on the reticle are made to be different from each other when the optical axis of exposing light and the center position of the reticle accord with each other, the center position of the mask pattern can be made to be different from the optical axis. Here upon, as long as the center position of the reticle and the center position of the mask pattern are different from each other, the difference amount between both the center positions, i.e., the relative positional relation between the reticle and the mask pattern, is not especially limited.

However, because, when the mask pattern on the reticle protrudes from the field circle of the exposure equipment, a pattern chip is generated, the center position of the reticle and the center position of the mask pattern are preferably made to be different from each other, so that the mask pattern may fall in the field circle. Accordingly, the center position of the mask pattern can be set under the condition in which at least one end of the mask pattern formed on the reticle does not protrude to the outside farther than the outermost circumferential part of the field circle.

Moreover, another one of the methods of manufacturing the semiconductor device of the present invention is related to a method of manufacturing a semiconductor device by exposing a predetermined region on a wafer by dividing the region into three parts of a center area and both outer side areas of the center area. A width of a mask pattern formed on a reticle used for exposure of the center area among the areas in a direction, along which the divided regions are arranged, is featured to be different from widths of mask patterns formed on reticles used for exposure of both the outer side areas in the same direction. For example, the width of the mask pattern formed on the reticle used for the exposure of the center area is narrower than the widths of the mask patterns formed on the reticles used for the exposure of both the outer side areas. Then, the joints between the patterns formed in each area are exposed by the light in the area in which an image height is further lowered. On the other hand, the width of the mask pattern formed on the reticle used for the exposure of the center area is made to be wider than the widths of the mask patterns formed on the reticles used for the exposure of both the outer side areas. Hereby, the joints between the patterns formed in each area become more distant to the outside from the center of the whole chip area formed finally.

Furthermore, a further one of the manufacturing methods of the semiconductor devices of the present invention is a method of manufacturing a semiconductor device performing divided exposure of a predetermined region on a wafer using two or more reticles, on each of which a mask pattern is formed, wherein a formation area of the mask pattern corresponding to each reticle differs from each other. The present invention is minutely described in embodiments below.

Embodiment 1

Figure 1:
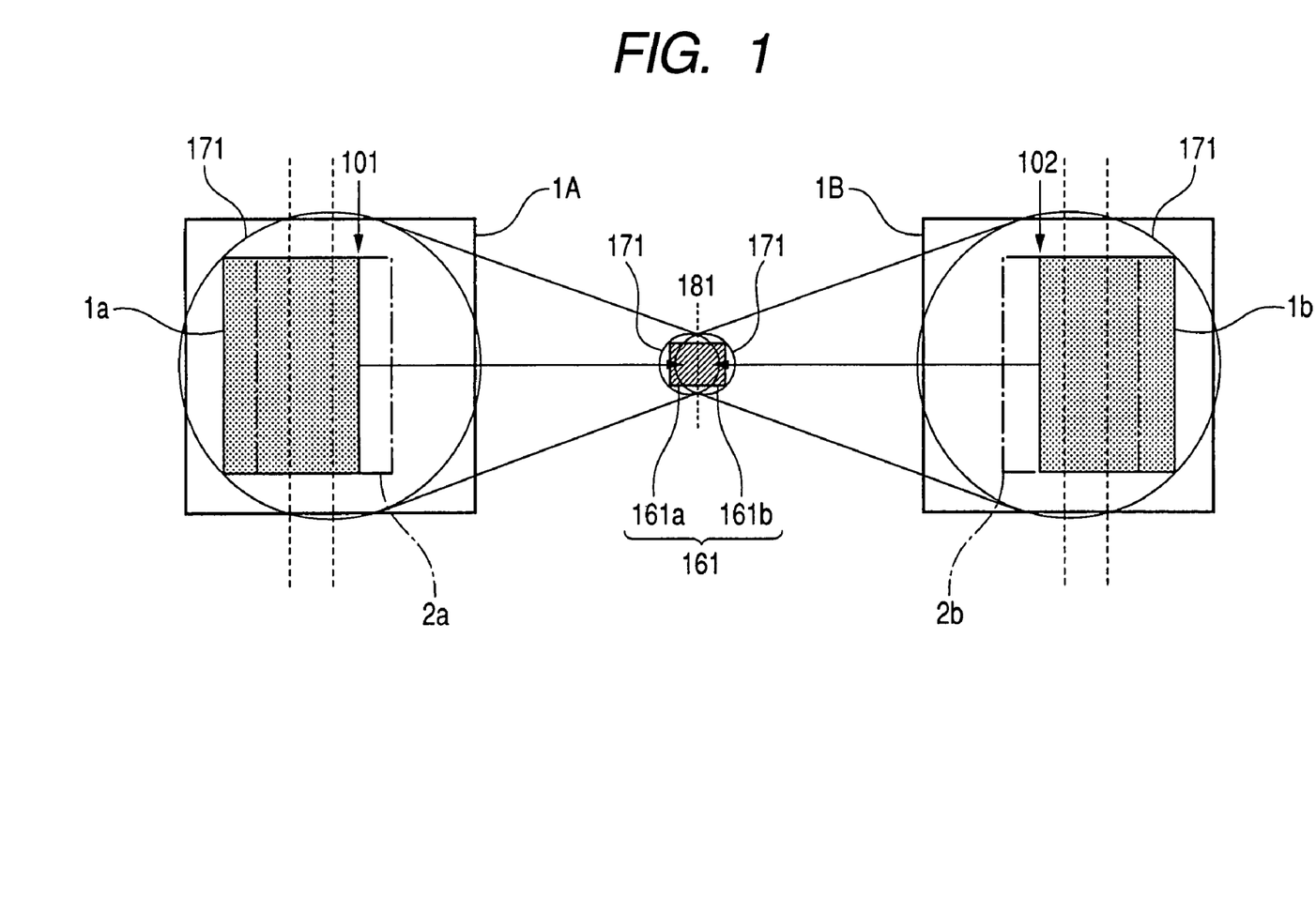
FIG. 1 is a schematic view illustrating an example of an exposure process in a method of manufacturing a semiconductor device of the present invention.
Figure 2:
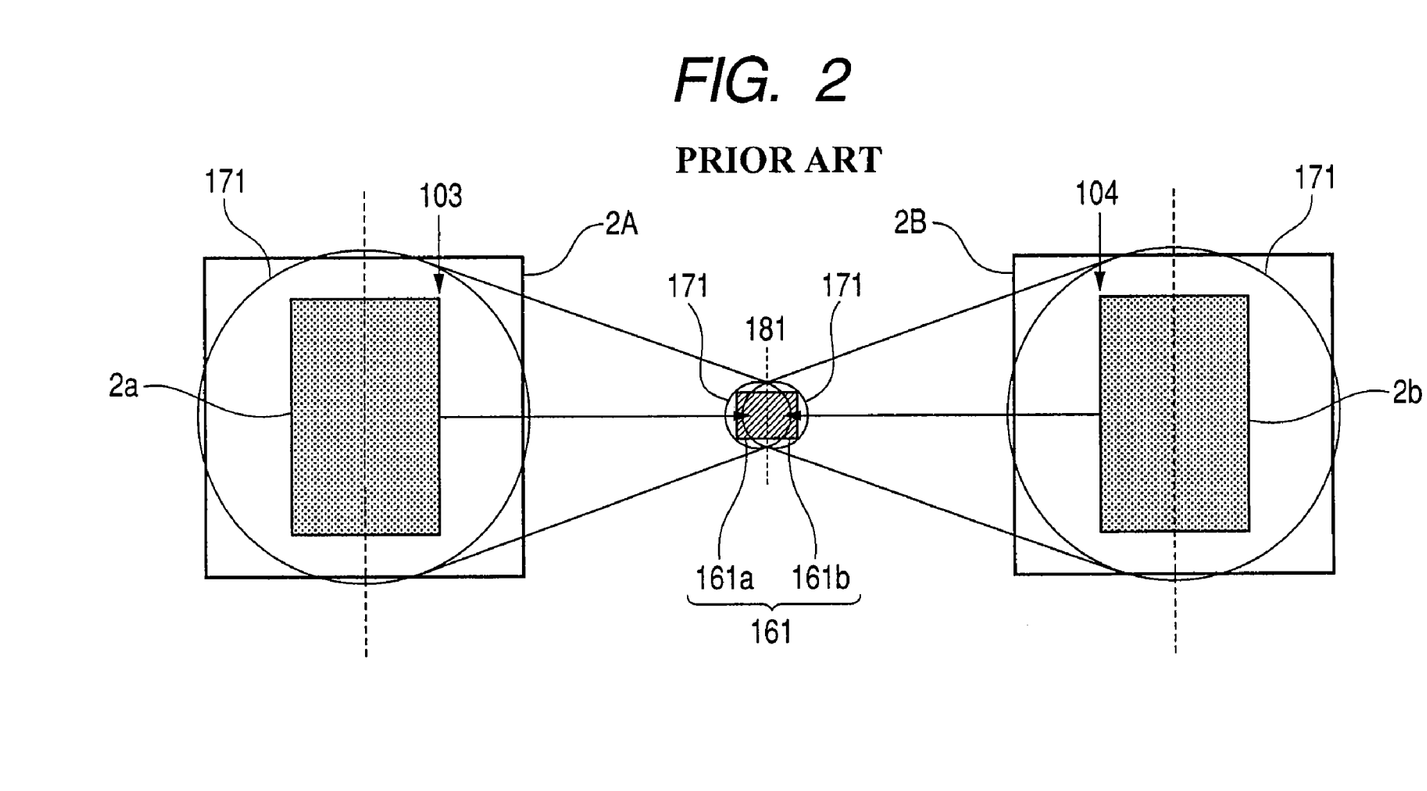
FIG. 2 is a schematic view illustrating a conventional exposure process contrasted with the exposure process shown in FIG. 1.

In the following, referring to the attached drawings, an example of the embodiments of the manufacturing method of the semiconductor device of the present invention is described. FIG. 1 is a schematic view illustrating the exposure process in the method of manufacturing the semiconductor device of the present embodiment. FIG. 2 is a schematic view illustrating a conventional exposure process, which is a contrast object.

In the exposure process shown in FIGS. 1 and 2, areas 161, shown by using oblique lines at substantially the centers of the drawing, correspond to exposure object areas (chip areas) on wafers. On the other hand, the insides of circles 171, shown in the drawings, correspond to areas capable of being exposed at one time (for example, a field circle of $\phi$ 31.1 mm), by sequential exposure equipment (e.g., a stepper). Consequently, the whole patterns arranged on the same layer of the chip areas 161 cannot be exposed at one time. Accordingly, each of the chip areas 161 is divided into two parts by a straight line cutting the chip area 161 vertically at the center of the area 161. A first exposure is performed using a reticle 1A (or a reticle 2A in FIG. 2), on which a mask, corresponding to an area 161a on the left side in the drawing, is formed (⅕ reduction transfer of the pattern is performed). Then, a second exposure is performed using a reticle 1B (or a reticle 2B in FIG. 2) corresponding to an area 161b on the right side (⅕ reduction transfer of the pattern is performed). That is, this is the divided exposure.

Here upon, the transfer lens of the stepper is designed by performing an aberration correction in order to perform the reduction transfers of the shapes of the mask patterns formed on the reticles onto the wafer. However, it is impossible to make the aberration zero, and, ordinarily, the aberration is the minimum on the optical axis, to be larger as the image height increases. In particular, the components of distortion, or the distortion of the shape of a transferred image, abruptly increases as the image height increases. Accordingly, it is to be desired to utilize the area where the image quality is best, effectively, when a pattern is exposed using the stepper. Accordingly, a general stepper is set so that the optical axis of exposing light may agree with the center of a reticle.

Accordingly, conventionally, as shown in FIG. 2, the centers of mask patterns 2a and 2b formed on the reticles 2A and 2B, respectively, are made to accord with the centers of the reticles 2A and 2B, respectively. Thereby, the center of the optical axis and the centers of the mask patterns 2a and 2b are made to agree with each other. Then, a first exposure is performed after a side (an alignment position 103) of the mask pattern 2a, formed on the reticle 2A, has been accurately aligned with the boundary line (a joining position 181) between the areas 161a and 161b on both sides. Moreover, a second exposure is performed also after a side (an alignment position 104) of the mask pattern 2b, formed on the reticle 2B, has been accurately aligned with the joining position 181.

On the other hand, in the exposure process of the present example shown in FIG. 1, the center of a mask pattern 1a, formed on the reticle 1A, is offset to the center of the reticle 1A, and the center of a mask pattern 1b, formed on the reticle 1B, is offset to the center of the reticle 1B. Incidentally, the positions of the mask patterns 2a and 2b are shown by alternate long and short dash lines in FIG. 1 for clarifying the positional differences between the mask patterns 1a and 1b and the mask patterns 2a and 2b, respectively. As is clear from FIG. 1, a side (an alignment position 101) of the mask pattern 1a is closer to the center of the reticle 1A in comparison with the corresponding alignment position 103 (FIG. 2) of the mask pattern 2a. Then, a side (an alignment position 102) of the mask pattern 1b is closer to the center of the reticle 1B in comparison with the corresponding alignment position 104 (FIG. 2) of the mask pattern 2b. Here upon, because the mask patterns 1a and 1b and the patterns formed on the wafer are related to one another as object points and their image points, respectively, that the alignment positions 101 and 102 of the mask patterns 1a and 1b are closer to the centers (i.e., optical axes) of the reticles 1A and 1B, means that the image heights become low.

Consequently, when exposure is performed after the alignment position 101 has been aligned at the joining position 181, and exposure is performed after the alignment position 102 has been aligned at the joining position 181, the boundary line between the areas 161a and 161b is formed using an area in which an image height is low, where aberration becomes relatively small. This fact means that the pattern difference between a pattern formed in the area 161a and a pattern formed in the area 161b become relatively less. In fact, a good result was obtained when a CMOS sensor of 35 mm full size was made on an experimental basis using the reticles 1A and 1B shown in FIG. 1, and the image property thereof was evaluated. To put it concretely, each color of a color filter and a micro lens formed on the color filter were formed using the divided exposure of the present embodiment. The amount of the output level step of an image signal generated at a joint of patterns formed by the divided exposure decreased compared with that of a similar CMOS sensor made on an experimental basis using the reticles 2A and 2B shown in FIG. 2. No output level steps were recognized in usual photographing. Moreover, an alignment difference amount and an output level step amount at a joint of patterns were evaluated. According to the results, an increase of a margin to the alignment difference could be recognized and compared with the similar CMOS sensor made on an experimental basis using the reticles 2A and 2B. Furthermore, divided exposure for a wiring layer, and the like, may be performed using the present embodiment.

Embodiment 2

Figure 3:
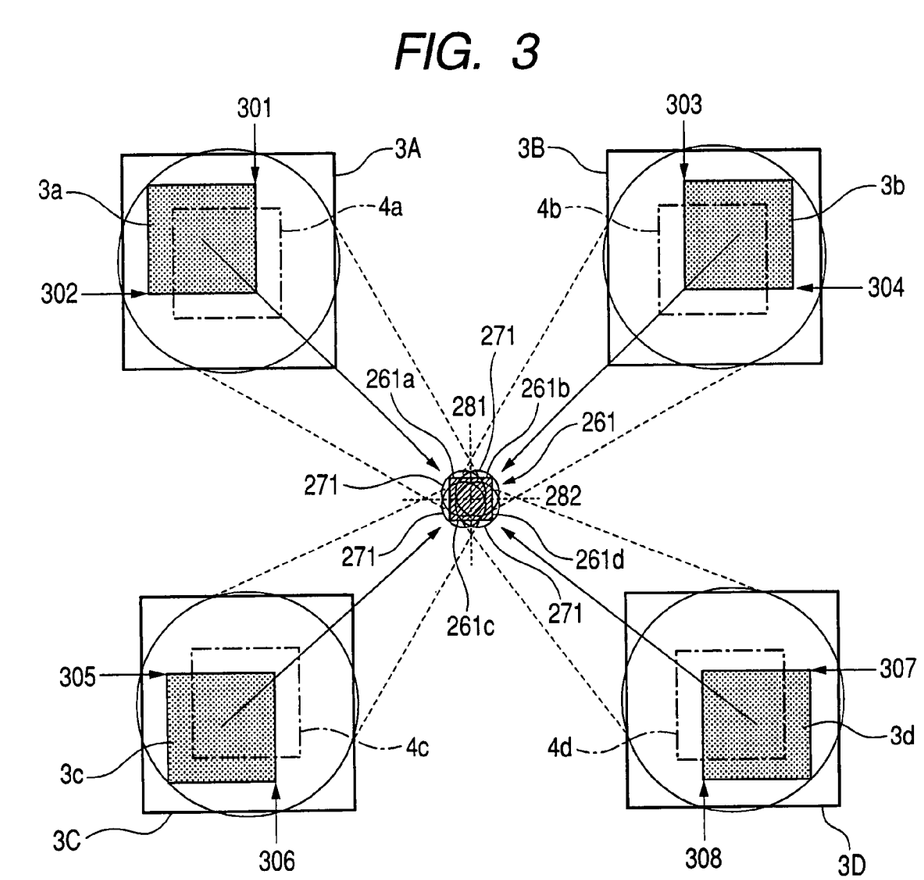
FIG. 3 is a schematic view illustrating another example of the exposure process in the method of manufacturing the semiconductor device of the present invention.
Figure 4:
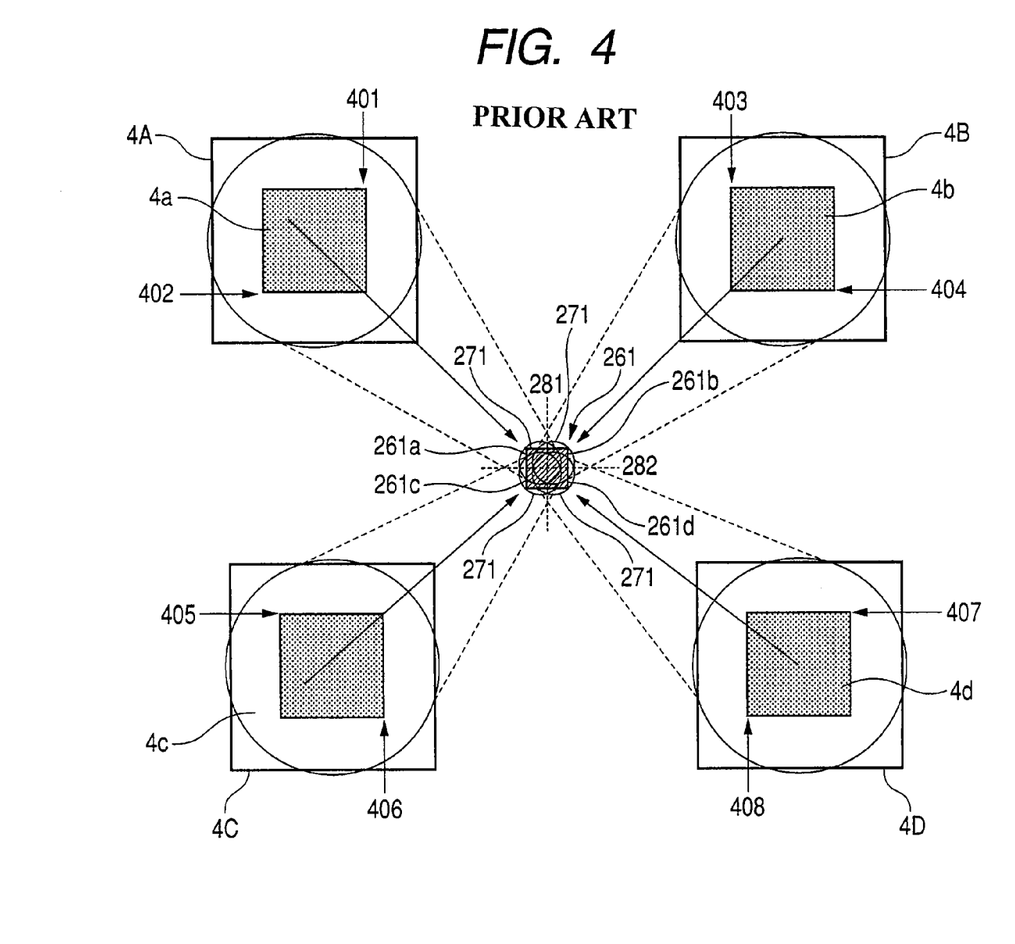
FIG. 4 is a schematic view illustrating a conventional exposure process contrasted with the exposure process shown in FIG. 3.

In the following, referring to the attached drawings, another example of the embodiment of the method of manufacturing the semiconductor device of the present invention is described. FIG. 3 is a schematic view illustrating an exposure process in a method of manufacturing a semiconductor device of the present example. FIG. 4 is a schematic view illustrating a conventional exposure process, or a contrast object.

In the exposure process shown in FIGS. 3 and 4, areas 261, shown in the neighborhood of the centers of the drawings using oblique lines, are the exposure object areas (chip areas) on wafers. On the other hand, the insides of the circles 271 shown in the drawings correspond to the areas capable of being exposed at one time (for example, field circles of $\phi$ 31.1 mm) by sequential exposure equipment (e.g., a stepper). Consequently, each of the whole chip areas 261 cannot be exposed at one time. Accordingly, each of the chip areas 261 is divided into four parts at the left, right, top and bottom thereof by two straight lines meeting at right angles at the center of the area 261, and exposure is performed by being divided into four times (⅕ reduction transfer of the pattern is performed). To put it concretely, a first exposure is performed using a reticle 3A (a reticle 4A in FIG. 4), on which a mask pattern, corresponding to an upper left area 261a shown in FIGS. 3 and 4, is formed. Subsequently, a second exposure is performed using a reticle 3B (a reticle 4B in FIG. 4), on which a pattern, corresponding to an upper right area 261*b*, is formed. Subsequently, a third exposure is performed using a reticle 3C (a reticle 4C in FIG. 4), on which a pattern corresponding to a lower left area 261*c* is formed. Lastly, a fourth exposure is performed using a reticle 3D (a reticle 4D in FIG. 4), on which a pattern corresponding to a lower right area 261*d* is formed.

The center positions of mask patterns 4*a*-4*d*, formed in the reticle 4A-4D, used for the conventional exposure process shown in FIG. 4, agree with the center positions of the reticles 4A-4D, which agree with the optical axis. Then, the first exposure is performed after a side (an alignment position 401) of the mask pattern 4*a* has been accurately aligned with a boundary line (a joining position 281) of the areas 260*a* and 261*c* and the areas 261*b* and 261*d*, and after another side (an alignment position 402) of the mask pattern 4*a* has been accurately aligned with the boundary line (a joining position 282) of the areas 261*a* and 261*b* and the areas 261*c* and 261*d*. Moreover, the second exposure is performed after a side (an alignment position 403) of the mask pattern 4*b* has been accurately aligned with the joining position 281, and after another side (an alignment position 404) of the mask pattern 4*b* has been accurately aligned with the joining position 282. Moreover, the third exposure is performed after a side (an alignment position 405) of the mask pattern 4*c* has been accurately aligned with the joining position 282, and after another side (an alignment position 406) of the mask pattern 4*b* has been accurately aligned with the joining position 281. Furthermore, the fourth exposure is performed after a side (an alignment position 407) of the mask pattern 4*d* has been accurately aligned with the joining position 282, and after another side (an alignment position 408) of a mask pattern 4*c* has been accurately aligned with the joining position 281.

On the other hand, the center positions of the mask patterns 3*a*-3*d* formed on the reticles 3A-3D, respectively, used for the exposure process in the method of manufacturing the semiconductor device of the present example, shown in FIG. 3, are made to be offset to the center positions of the reticles 3A-3D, respectively, which agree with the optical axis. To put it concretely, the mask pattern 3*a* is offset into the upper left direction in the drawing from the center of the reticle 3A, and the mask pattern 3*b* is offset into the upper right direction in the drawing from the center of the reticle 3B. Then, the mask pattern 3*c* is offset into the lower left direction in the drawing from the center of the reticle 3C, and the mask pattern 3*d* is offset into the lower right direction in the drawing from the center of the reticle 3C. The directions into which the offsetting is performed are ones into which the exposure patters formed by the respective mask patterns are located in the semiconductor device to the center area of the semiconductor device. Incidentally, the positions of the mask patterns 4*a*-4*d* are shown by alternate long and short dash lines in FIG. 3 for clarifying the positional differences between the mask patterns 3*a*-3*d* and the mask patterns 4*a*-4*d*. As is clear from FIG. 3, two sides (alignment positions 301 and 302) of the mask pattern 3*a* are closer to the center of the reticle 3A in comparison with the corresponding alignment positions 401 and 402 (FIG. 4) of the mask pattern 4*a*. Then, two sides (alignment positions 303 and 304) of the mask pattern 3*b* are closed to the center of the reticle 3B in comparison with the corresponding alignment positions 403 and 404 (FIG. 4) of the mask pattern 4*b*. Moreover, two sides (alignment positions 305 and 306) of the mask pattern 3*c* are closer to the center of the reticle 3C in comparison with the corresponding alignment positions 405 and 406 (FIG. 4) of the mask pattern 4*c*. Then, two sides (alignment positions 307 and 308) of the mask pattern 3*d* are closer to the center of the reticle 3D in comparison with the corresponding alignment positions 407 and 408 (FIG. 4) of the mask pattern 4*d*. That is, the alignment position of each of the mask patterns 3*a*-3*d* is set at a closer position to the optical axis of the light for exposure.

Accordingly, a first exposure is performed after the alignment positions 301 and 302 of the mask pattern 3*a* formed on the reticle 3A has been accurately aligned with the joining positions 281 and 282. Then, a second exposure is performed after the alignment positions 303 and 304 of the mask pattern 3*b* formed on the reticle 3B have been accurately aligned with the joining positions 281 and 282. Then, a third exposure is performed after the alignment positions 305 and 306 of the mask pattern 3*c* formed on the reticle 3C have been accurately aligned with the joining positions 281 and 282. Then, a fourth exposure is performed after the alignment positions 307 and 308 of the mask pattern 3*d* formed on the reticle 3D have been accurately aligned with the joining positions 281 and 282. Hereby, the boundary line of each of the areas 261*a*-261*d*, which has received the divided exposure, is formed using an area in which an image height is lower, where aberration is relatively small. This fact means that the pattern differences between the patterns formed in the respective areas 261*a*-261*d* become little. In fact, when a CMOS sensor of a 645 format of a film-based camera, i.e., 41 mm×56 mm in size, was made on an experimental basis using the reticles 3A-3D, shown in FIG. 3, and the image property was evaluated, a good result could be obtained. To put it concretely, the amount of the output level step of an image signal generated at a joint between the patterns formed by divided exposure was decreased in comparison with that of a similar CMOS sensor made on an experimental basis using the reticles 4A-4D, shown in FIG. 4. Then, in ordinary photographing, no output level steps were recognized. Moreover, when an alignment difference amount at a joint between patterns and the amount of an output level step were evaluated, an increase of a margin to an alignment difference can be recognized in comparison with that of the similar CMOS sensor made on an experimental basis using the reticles 4A-4D.

Embodiment 3

Figure 5:
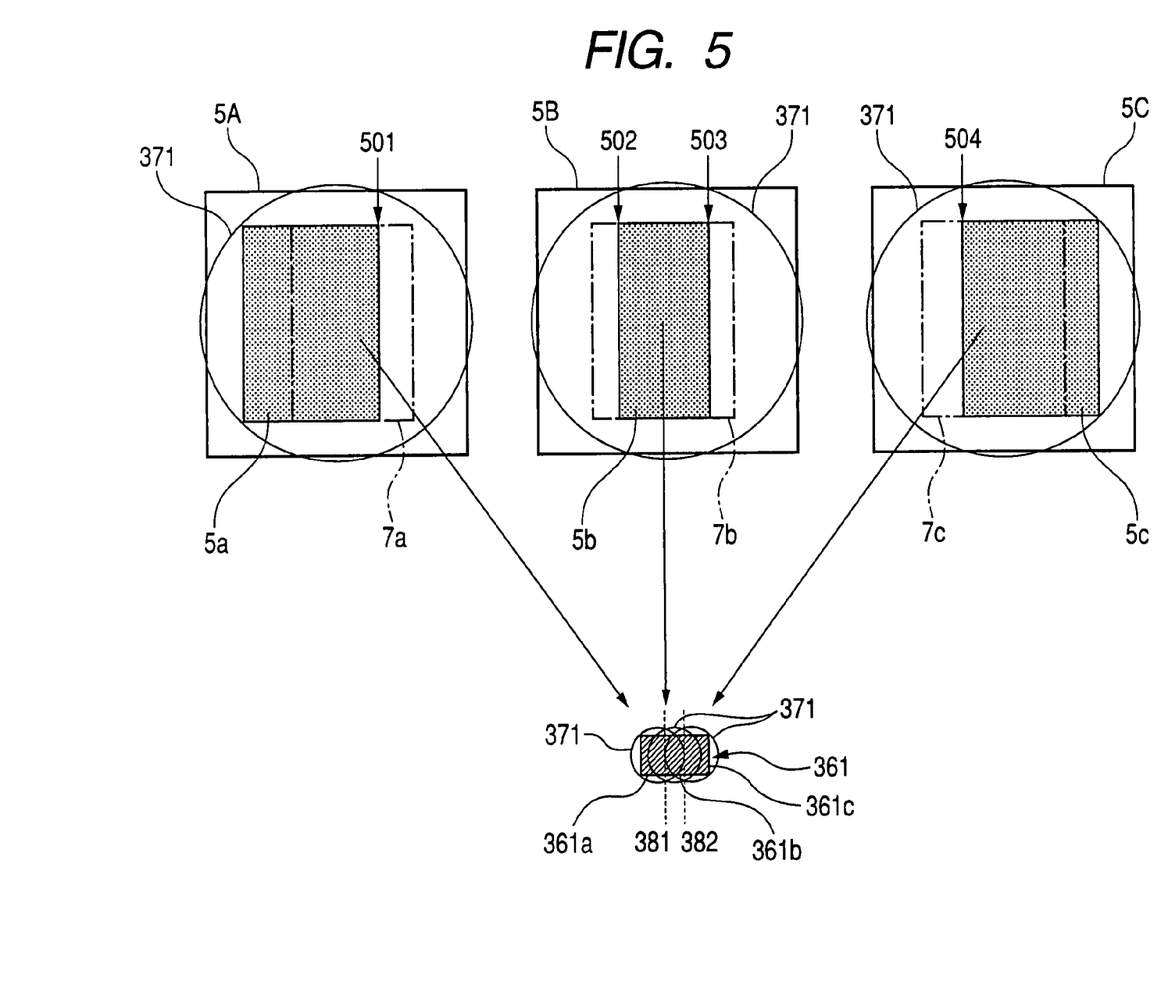
FIG. 5 is a schematic view illustrating a further example of the exposure process in the method of manufacturing the semiconductor device of the present invention.
Figure 7:
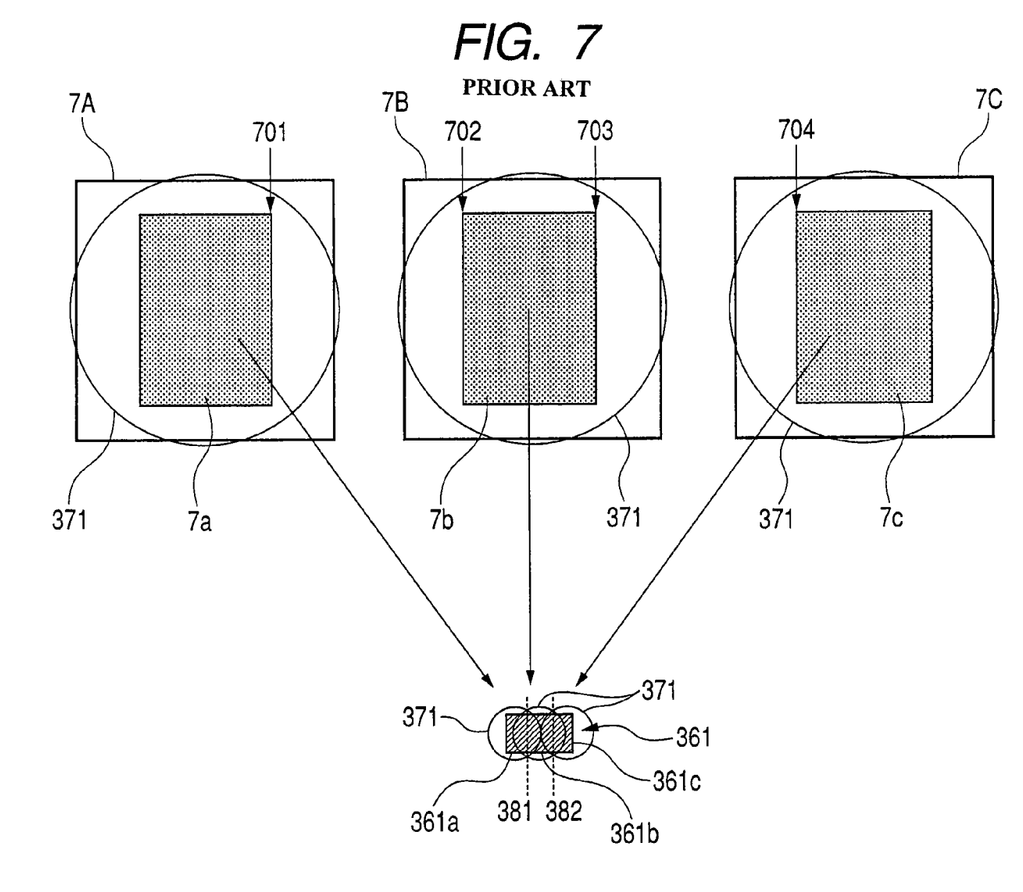
FIG. 7 is a schematic view illustrating a conventional exposure process contrasted with the exposure process shown in FIGS. 5 and 6.

In the following, referring to the attached drawings, a further example of the embodiment of the method of manufacturing the semiconductor device of the present invention is described. FIG. 5 is a schematic view illustrating the exposure process in the method of manufacturing the semiconductor device of the present example. FIG. 7 is a schematic view illustrating a conventional exposure process, which is a contrast object.

In the exposure processes shown in FIGS. 5 and 7, areas 361, shown using oblique lines in the drawings, are the exposure object areas (chip areas) on wafers. On the other hand, the insides of circles 371, shown in the drawings, correspond to the areas capable of being exposed at one time (for example, field circles of φ 31.1 mm) by sequential exposure equipment (e.g., a stepper). Consequently, each section of the whole chip area 361 cannot be exposed at one time. Accordingly, each of the chip areas 361 is divided into three parts by two parallel straight lines dividing the chip area 361 vertically, and exposure is performed by being divided into three times (⅓ reduction transfer of the pattern is performed). To put it concretely, a first exposure is performed using a reticle 5A (a reticle 7A in FIG. 7), on which a mask pattern corresponding to an area 361*a* on the left end, shown in FIGS. 5 and 7, is formed. Lastly, a third exposure is performed using a reticle 5C (a reticle 7C in FIG. 7), on which a pattern corresponding to an area 361*c* on the right end is formed.

All of mask patterns 7a-7c formed on the reticles 7A-7C, respectively, used for the conventional exposure process shown in FIG. 7, have the same size, and the respective center positions of the mask patterns 7a-7c agree with the center positions of the reticles 7A-7C, respectively, which agree with the optical axis. Then, the first exposure is performed after a side (an alignment position 701) of the mask pattern 7a, formed on the reticle 7A, has been accurately aligned with a boundary line (a joining position 381) of the areas 361a and 361b. Moreover, the second exposure is performed after a side (an alignment position 702) on the left side of the mask pattern 7b, formed on the reticle 7B, has been accurately aligned with the joining position 381, and after another side (an alignment position 703) of the mask pattern 7b has been accurately aligned with a boundary line (a joining position 382) of the areas 361b and 361c. Moreover, the third exposure is performed after a side (an alignment position 704) of the mask pattern 7c, formed on the reticle 7C, has been accurately aligned with the joining position 382.

On the other hand, the center positions of mask patterns 5a and 5c, formed on the reticles 5A and 5C, respectively, used for the exposure process in the method of manufacturing the semiconductor device of the present example, shown in FIG. 5, are made to be offset from the center positions of the reticles 5A and 5C, respectively, which agree with the optical axis. To put it concretely, the mask pattern 5a, shown in FIG. 5, is offset to the left side in the drawing from the center of the reticle 5A, and the mask pattern 5c is offset to the right side in the drawing from the center of the reticle 5C. That is, the mask patterns 5a and 5c are offset into the directions in which the exposure patterns formed by the mask patterns 5a and 5c are located in the semiconductor device from the center area of the semiconductor device. Moreover, a mask pattern 5b, formed on the reticle 5B, is formed to be narrower in width than that of the mask pattern 7b, shown in FIG. 7. That is, the formation area of the mask pattern formed on each reticle is different from one another. That is, the widths of the mask patterns 5a and 5c are expanded in comparison with the widths of the mask patterns 7a and 7c by the narrowed width of the mask pattern 5b, and the total width of the mask patterns 5a-5c is the same as the total width of the mask patterns 7a-7c. Incidentally, the mask patterns 7a-7c are shown by alternate long and short dash lines in FIG. 5 for clarifying the positional differences between the mask patterns 5a-5c and the mask patterns 7a-7c. As is clear from FIG. 5, a side (an alignment position 501) of the mask pattern 5a is closer to the center of the reticle 5A in comparison with the corresponding alignment position 701 (FIG. 7) of the mask pattern 7a. Then, a side (an alignment position 504) of the mask pattern 5c is closer to the center of the reticle 5C in comparison with the corresponding alignment position 704 (FIG. 7) of the mask pattern 5c. Moreover, two sides (alignment positions 502 and 503) of the mask pattern 5b are closer to the center of the reticle 5B in comparison with the corresponding alignment positions 702 and 703 (FIG. 7) of the mask pattern 7b. That is, the alignment position of each of the mask patterns 5a-5c is set at a closer position to the optical axis of the light for exposure.

Consequently, the boundary line of each of the areas 361a-361c, in which divided exposure has been performed, is formed using an area in which an image height is lower, where aberration becomes relatively smaller. This fact means that the pattern difference between the patterns formed in the respective areas 361a-361c decreases. In fact, when a CMOS sensor of the 35 mm full size was made on an experimental basis using the reticles 5A-5C, shown in FIG. 5, and the image property thereof was evaluated, and a good result was obtained. To put it concretely, the amount of the output level step of an image signal generated at a joint between the patterns formed by the divided exposure increased in comparison with that of the similar CMOS sensor made on an experimental basis using the reticles 7A-7C, shown in FIG. 7, and no output level steps could be recognized in normal photographing. Moreover, when the alignment difference amount and the amount of the output level step at a joint between patterns were evaluated, an increase of a margin to the alignment difference was confirmed, in comparison with that of the similar CMOS sensor made on an experimental basis using the reticles 7A-7C. Moreover, a decrease of the amount of the output level step was confirmed when the position of a joint between patterns was put to be closer to the center of a chip, although the positional difference amounts between patterns were the same. The phenomenon can be considered to be caused by the following reason. That is, a light beam enters the neighborhood of the center of an image pickup element substantially vertically, but a ratio of light beams entering an area obliquely increases as the area approaches the periphery of the image pickup element. In particular, as a CMOS sensor, in a case of having a long optical path length in the sensor and many laminated structures, such as a micro lens, a color filter, a flattening layer, an Al wiring layer, an interlayer insulation film, a wiring made of Poly-Si, the effect is large. It is conceivable that the reason is that, even if a slight joint difference is generated, because a light beam enters obliquely, the slight difference between the opening widths and light beam amount passing to the light receiving portion through a gap between patterns sensitively changes.

Accordingly, in a case of performing three-division exposure in a lateral direction or the longitudinal direction, the shot width of the center is narrowed, and the boundary lines between the center area and both the outer side areas thereof are exposed using light in the area in which an image height is made smaller, as much as possible. Thereby, an effect of suppressing the generation of aberration in the exposure can be obtained. Moreover, in addition to the effect, by arranging the position of a joint between patterns in a solid state image pickup element in an area in which the angle of an incident light beam becomes nearer to a right angle, it was ascertained that the effect of decreasing the output difference at the joint could be obtained.

Embodiment 4

Figure 6:
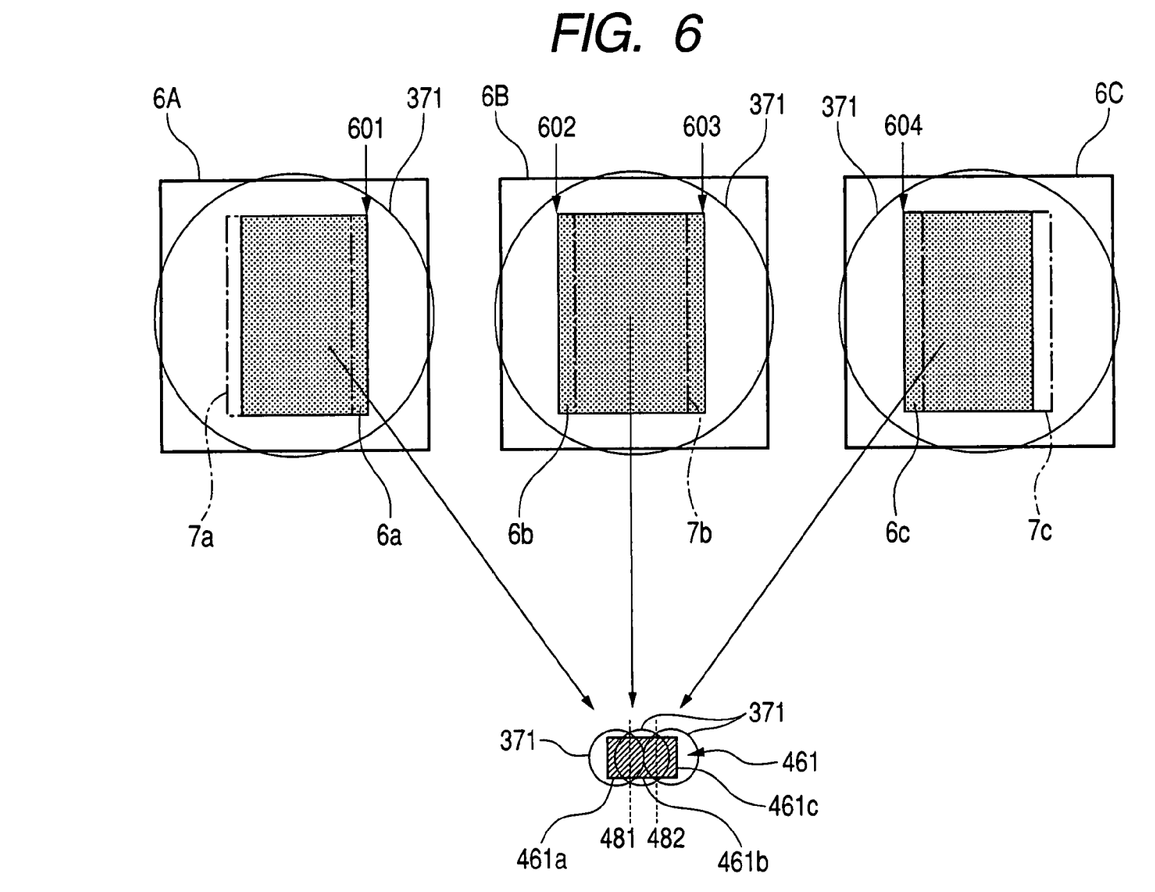
FIG. 6 is a schematic view illustrating a still further example of the exposure process in the method of manufacturing the semiconductor device of the present invention.

In the following, referring to the attached drawings, a still further example of the embodiment of the method of manufacturing the semiconductor device of the present invention is described. FIG. 6 is a schematic view illustrating the exposure process in the method of manufacturing the semiconductor device of the present example. As a conventional exposure process contrasted with the exposure process in the present example, there is the exposure process described with regard to Embodiment 3, using FIG. 7.

In the exposure process shown in FIG. 5, a chip area 461, shown using oblique lines in the drawing is divided into three parts in the right and left direction in the drawing by two straight lines dividing the chip area 416 vertically. Then, areas 461a, 461b and 461c are exposed using reticles 6A, 6B and 6C, respectively. The basic configuration of the exposure process of Embodiment 4 is the same as the exposure process of Embodiment 3. Accordingly, the parts common to those of the exposure process of Embodiment 3 are denoted by the same reference characters as those of the exposure process of Embodiment 3, and their descriptions are omitted. Only the features of the exposure process in the present example are described in the following.

When a pattern is formed by repeating exposure a plurality of times to connect a plurality of patterns, as described above, it is desirable to perform a mask design so that the joints of the patterns are formed using the areas in which image heights are lower, where the aberration of the exposing light becomes smaller, as much as possible. However, when a specific area, in which the producing of a joining part is desired to be avoided, exists owing to a characteristic of a chip, that fact must be reflected to the layout of a mask. In this case, that area, in which the existence of joining parts is permitted, is limited. In such a case, by forming the center area so as to have a wider width in comparison with the center area in the case in which the chip area is equally divided into three parts, the pattern formed in the center area is connected to the patterns formed in both the center side areas thereof using areas in each of which an image height is higher than that of the conventional exposure process, as a result. That is, the formation area of the mask pattern formed on each reticle is different. In this case, when patterns are joined together mutually in the areas in which the generation situations of aberration are equal by shifting the arrangement of the mask pattern on each reticle so that the image height of a joint may accord with each other in each reticle, the characteristic differences between the connected areas can be reduced.

Accordingly, in the exposure process in the present example, the center position of a mask pattern 6a of a reticle 6A is shifted to the right side in FIG. 6 than the center position of reticle 6A. Hereby, an alignment position 601 of the mask pattern 6a is shifted into the direction in which an image height becomes higher in comparison with the case where the center position of the reticle 6A agrees with the center position of the mask pattern 6a. Here upon, even if the image height becomes higher, the positional difference between the patterns connected together can be reduced by joining the areas in which the image heights are the same, together with each other, in comparison with the case where the areas in which image heights differ from each other are joined to each other.

Moreover, the center position of a mask pattern 6c of the reticle 6C is shifted to the left side from the center position of the reticle 6C. Hereby, also, an alignment position 604 of the mask pattern 6c has shifted into the direction in which the image height becomes lower, in comparison with the case wherein the center position of the reticle 6C agrees with the center position of the mask pattern 6c. Moreover, a mask pattern 6b of the reticle 6B is shaped to be wider in width in comparison with the widths of the mask patterns 6a and 6c.

As a result, a first exposure is performed after the alignment position 601 of the mask pattern 6a, formed on the reticle 6A, has been accurately aligned with a boundary line (a joining position 481) of the areas 461a and 461b on the wafer. Then, a second exposure is performed after an alignment position 602 of the mask pattern 6b formed on the reticle 6B has been accurately aligned with the joining position 481, and after another alignment position 603 has been accurately aligned with a boundary line (joining position 482) of the areas 461b and 461c. Then, a third exposure is performed after the alignment position 604 of the mask pattern 6c, formed on the reticle 6C, has been accurately aligned with the joining position 482. Hereby, the image heights at the joining positions 481 and 482 become equal to each other, and a pattern, in which positional differences and shape differences at joining positions are little, can be formed.

A good result was obtained when a CMOS sensor of 35 mm full size was made on an experimental basis using the reticles 6A-6C, shown in FIG. 6, and the image property thereof was evaluated. To put it concretely, the amounts of the output level steps of an image signal generated at the joints of the patterns formed by the divided exposure were almost the same as those of the CMOS sensor made on an experimental basis using the reticles 7A-7C, shown in FIG. 7, on which the pattern arrangements were not shifted. On the other hand, the generation positions of the joints were shifted to positions nearer to the ends of the chip in comparison with the those of the CMOS sensor, made on an experimental basis using the reticle 7A-7C. That is, the joints of the patterns were generated relatively nearer to the center of the chip in the CMOS sensor made on an experimental basis using the reticle 7A-7C, on which the pattern arrangements were uniform. Consequently, image unevenness caused by the pattern differences was generated near the center of an image. On the other hand, in the CMOS sensor made on an experimental basis using the reticles 6A-6C, shown in FIG. 6, the joints of the patterns were generated at the positions relatively distant from the center of the chip. Consequently, even if the image unevenness caused by the pattern differences were generated, the unevenness was generated at positions near to both the ends of the image where the unevenness was relatively difficult to be conspicuous.

Besides the descriptions with regard to the third and fourth embodiments, it is effective to make the formation area of the mask pattern formed on each reticle different from each other at the time of performing the divided exposure. For example, when a pattern position on a reticle is shifted so that a certain specific area may be located at the center of an optical axis of exposure equipment, in order to minimize the aberration in the specific area, the pattern protrudes form the exposure area, and divided exposure becomes necessary. In that case, by making the pattern area formed on each reticle different from each other, the situation can be easily dealt with. As a concrete example of the differentiation, a case in which circuit units having different functions are integrated in the same chip is effective.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of manufacturing a photoelectric conversion device by performing divisional exposure on a predetermined area on a surface of a wafer, through two or more reticles including first and second reticles, on each of which a mask pattern region is formed, such that each center position of the first and second reticles is different from each center position of whole regions of the mask patterns formed on the first and second reticles, the method comprising the steps of:

arranging the first and second reticles such that (1) the whole region of the mask pattern formed on the first reticle is shifted in a first direction from a joining position of the divisional exposure, (2) the whole region of the mask pattern formed on the second reticle is shifted in a second direction opposite to the first direction from the joining position of the divisional exposure, and (3) each center position of the first and second reticles is aligned with each optical center of exposure light beams of the first and second reticles; and exposing, to exposure light, the wafer through the first and second reticles, arranged in the arranging step, to form a latent image on the wafer, such that a latent image is formed in a region close to the optical center of an exposure light beam that connects latent image patterns formed on the wafer through the first and second reticles.

2. The method according to claim 1, wherein the exposing step is performed by exposing each of the reticles used separately.

3. The method according to claim 2, wherein the exposing step comprises performing divided exposure.

4. The method according to claim 1, further comprising, prior to the exposing step, aligning, at a predetermined position, (i) a side, near a center of the at least one reticle, of the mask pattern region formed on the at least one reticle with (ii) a side of the mask pattern region formed on another of the at least two of the plurality of reticles.

5. The method according to claim 4, wherein the predetermined position is a joining position of the sides of the mask pattern regions formed on the reticles.

6. The method according to claim 1, wherein the photoelectric conversion device is an image pickup device, and the mask pattern regions are pattern regions for forming color filters used for the image pickup device.

7. The method according to claim 1, wherein the photoelectric conversion device is an image pickup device, and the mask pattern regions are pattern regions for forming micro lenses used for the image pickup device.

8. The method according to claim 1, wherein (i) the center of the at least one reticle aligned with the optical axis of a light beam for exposure is shifted from (ii) the center of the mask pattern region formed on the at least one reticle, so as to shift a joining position between sides of the mask pattern regions closer to the optical axis of the exposure light beam.

* * * * *